(12) United States Patent
Kim et al.

(10) Patent No.: US 6,710,726 B2
(45) Date of Patent: Mar. 23, 2004

(54) SERIALIZER-DESERIALIZER CIRCUIT HAVING INCREASED MARGINS FOR SETUP AND HOLD TIME

(75) Inventors: Ji-Young Kim, Osan (KR); Jae-yup Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/317,327

(22) Filed: Dec. 12, 2002

(65) Prior Publication Data

US 2003/0189503 A1 Oct. 9, 2003

(30) Foreign Application Priority Data

Apr. 3, 2002 (KR) ........................................ 2002-18251

(51) Int. Cl.[7] ................................................ H03M 9/00
(52) U.S. Cl. ........................................ 341/100; 341/101
(58) Field of Search ................................ 341/100, 101; 375/360

(56) References Cited

U.S. PATENT DOCUMENTS 4,864,303 A * 9/1989 Ofek ............................ 341/95
5,982,309 A * 11/1999 Xi et al. ...................... 341/101

* cited by examiner

Primary Examiner—Brian Young
Assistant Examiner—Joseph Lauture
(74) Attorney, Agent, or Firm—F. Chau & Associates, LLC

(57) ABSTRACT

A serializer-deserializer circuit having increased margins for setup and hold time is provided. The serializer-deserializer circuit comprises a data skew control circuit, a latch circuit, a serial converter circuit, and a phase locked loop (PLL). The data skew control circuit receives a first clock signal and a data signal, delays the data signal, and outputs a delayed data signal in response to a reference clock signal. The latch circuit latches and outputs the delayed data signal in response to the reference clock signal. The serial converter circuit receives and serializes an output signal of the latch circuit in response to the reference clock signal to output serial data. The PLL generates the reference clock signal in response to an external reference clock signal. Instead of using the first clock signal input with the data signal, the serializer-deserializer circuit uses a signal, which is generated by an oscillator and thus has a small amount of jitter, as an input clock to the PLL so that a reference clock signal without noise is generated to improve the operation of the serializer-deserializer circuit. In addition, the reference clock signal output from the PLL is locked to the data signal to increase margins for setup and hold time during the latch operation of the data signal.

18 Claims, 6 Drawing Sheets

SERIALIZER-DESERIALIZER CIRCUIT HAVING INCREASED MARGINS FOR SETUP AND HOLD TIME

BACKGROUND OF THE INVENTION

1. Field of the Invention

The present invention relates to a high data rate (HDR) communication system, and more particularly, to a serializer-deserializer circuit having increased margins for setup and hold time.

2. Discussion of Related Art

Serializer-deserializer circuits that are essential to an HDR communication system receive parallel data and convert it into serial data, or receive serial data and convert it into parallel data, and transfer this converted data at high speed. In general, serializer-deserializer circuits use a clock signal, which is locked to and input with an input data signal, as a reference clock of a phase locked loop (PLL).

FIG. 1 is a block diagram of a conventional serializer-deserializer circuit. Referring to FIG. 1, a serializer-deserializer circuit 10 includes a data skew control circuit 20, a latch circuit 30, a serial converter circuit 40, and a PLL 50. The PLL 50 operates by receiving a clock signal TBC to which a data signal TXD is locked. The PLL 50 outputs a reference clock signal TBCREF having the same frequency as the clock signal TBC, to the latch circuit 30.

The data skew control circuit 20 receives the data signal TXD in response to the reference clock signal TBCREF to control the skew of the data signal TXD and outputs a data signal DTXD to the latch circuit 30. The latch circuit 30 receives and latches the signal DTXD, which is locked to the reference clock signal TBCREF, and outputs a latched signal LDTXD. The serial converter circuit 40 serializes and outputs the signal LDTXD in response to the reference clock signal TBCREF.

Here, the clock signal TBC, which is locked to the data signal TXD and input together to the serializer-deserializer circuit 10 with the data signal, is usually not a clean signal generated from an oscillator, but has coarse characteristics, such as peak-to-peak jitters of over 100 picoseconds (ps). The PLL 50 which operates and generates signals based on the clock signal TBC has coarse characteristics as well.

Under HDR conditions where there is a transfer rate of several gigabits per second (Gbps), the overall characteristics of a communication system are affected by the jitter characteristics of an output signal from a PLL used in the communication system. Consequently, improving the jitter characteristics of the output signal from the PLL improves noise, setup and hold margins, etc, thereby improving system performance.

SUMMARY OF THE INVENTION

The present invention is directed to a serializer-deserializer circuit having improved transfer characteristics using a clock signal, which is generated by an oscillator, as an input signal to a phase locked loop (PLL), instead of using a clock signal locked to a data signal as the input signal to the PLL.

A serializer-deserializer circuit according to a first embodiment of the present invention includes a data skew control circuit, a latch circuit, a serial converter circuit, and a phase locked loop (PLL). Here, the data skew control circuit receives a first clock signal and a data signal, delays the data signal, and outputs a delayed data signal in response to a reference clock signal.

The latch circuit latches and outputs the delayed data signal in response to the reference clock signal. The serial converter circuit receives and serializes the delayed data signal output from the latch circuit in response to the reference clock signal to output serial data. The PLL generates the reference clock signal in response to an external reference clock signal.

Preferably, the data skew control circuit includes a first delay circuit, a second delay circuit, and a selection code signal generation circuit. Here, the first delay circuit receives and delays the first clock signal in response to an m-bit selection code signal (where m is a natural number) to generate a second clock signal. The second delay circuit receives and delays a data signal in response to the selection code signal to generate the delayed data signal.

The selection code signal generation circuit receives the reference clock signal and the second clock signal, and varies the logic value of the selection code signal until a phase of the reference clock signal is the same as that of the second clock signal to fix the logic value of the selection code signal.

The first delay circuit includes a delay buffer unit having a plurality of buffers that are connected in serial, wherein a first buffer receives the first clock signal, and a selection circuit for selecting an output of one of the buffers in response to the selection code signal and outputting the selected signal as the second clock signal.

The selection code signal generation circuit includes a first flip-flop for receiving and outputting the second clock signal in response to the reference clock signal, a second flip-flop for receiving and outputting the output of the first flip-flop in response to the reference clock signal, an exclusive OR unit for performing an exclusive OR operation on the outputs of the first and second flip-flops, and an up/down counter for increasing and decreasing the logic value of the selection code signal in response to the output of the exclusive OR unit. The second delay circuit is the same as the first delay circuit. The period of the first clock signal is the same as that of the reference clock signal.

The latch circuit latches the data signal at falling edges of the reference clock signal when the data signal has a first speed, and the latch circuit latches the data signal at falling edges of a clock signal having twice the frequency as the reference clock signal when the data signal has a second speed. The PLL outputs the reference clock signal and the clock signal having twice the frequency as the reference clock signal. The external reference clock signal is generated by an oscillator.

A data skew control circuit according to a second embodiment of the present invention includes a first delay circuit, a second delay circuit, and a selection code signal generation circuit. Here, the first delay circuit receives and delays a first clock signal in response to an m-bit selection code signal (where m is natural number) to generate a second clock signal. The second delay circuit receives and delays a data signal in response to the m-bit selection code signal to generate a delayed data signal.

The selection code signal generation circuit receives a reference clock signal and the second clock signal and varies the logic value of the selection code signal until a phase of the reference clock signal is the same as that of the second clock signal to fix the logic value of the selection code signal.

The first delay circuit includes a delay buffer unit having a plurality of buffers that are connected in serial, wherein a first buffer receives the first clock signal, and a selection circuit for selecting an output from one of the buffers in response to the selection code signal and outputting the selected signal as the second clock signal.

The selection code signal generation circuit includes a first flip-flop for receiving and outputting the second clock signal in response to the reference clock signal, a second flip-flop for receiving and outputting the output of the first flip-flop in response to the reference clock signal, an exclusive OR unit for performing an exclusive OR operation on the outputs of the first and second flip-flops, and an up/down counter for increasing and decreasing the logic value of the selection code signal in response to the output of the exclusive OR unit.

The second delay circuit is the same as the first delay circuit and the period of the first clock signal is the same as that of the reference clock signal. The reference clock signal is generated by a PLL, which is operated in response to an external reference clock signal generated from a predetermined oscillator.

According to preferred embodiments of the present invention, rather than using the first clock signal input with the data signal, the serializer-deserializer circuit uses a signal, which is generated by an oscillator and has a small amount of jitter, as an input clock to the PLL so that a reference clock signal without noise is generated to improve the operation of the serializer-deserializer circuit. In addition, the reference clock signal output from the PLL is locked to the data signal to increase margins for setup and hold time during the latch operation of the data signal.

These and other aspects, object, feature and advantages of the present invention will be described or become apparent from the following detailed description of preferred embodiments, which is to be read in connection with the accompanying drawings.

DETAILED DESCRIPTION OF PREFERRED EMBODIMENTS

Figure 1:
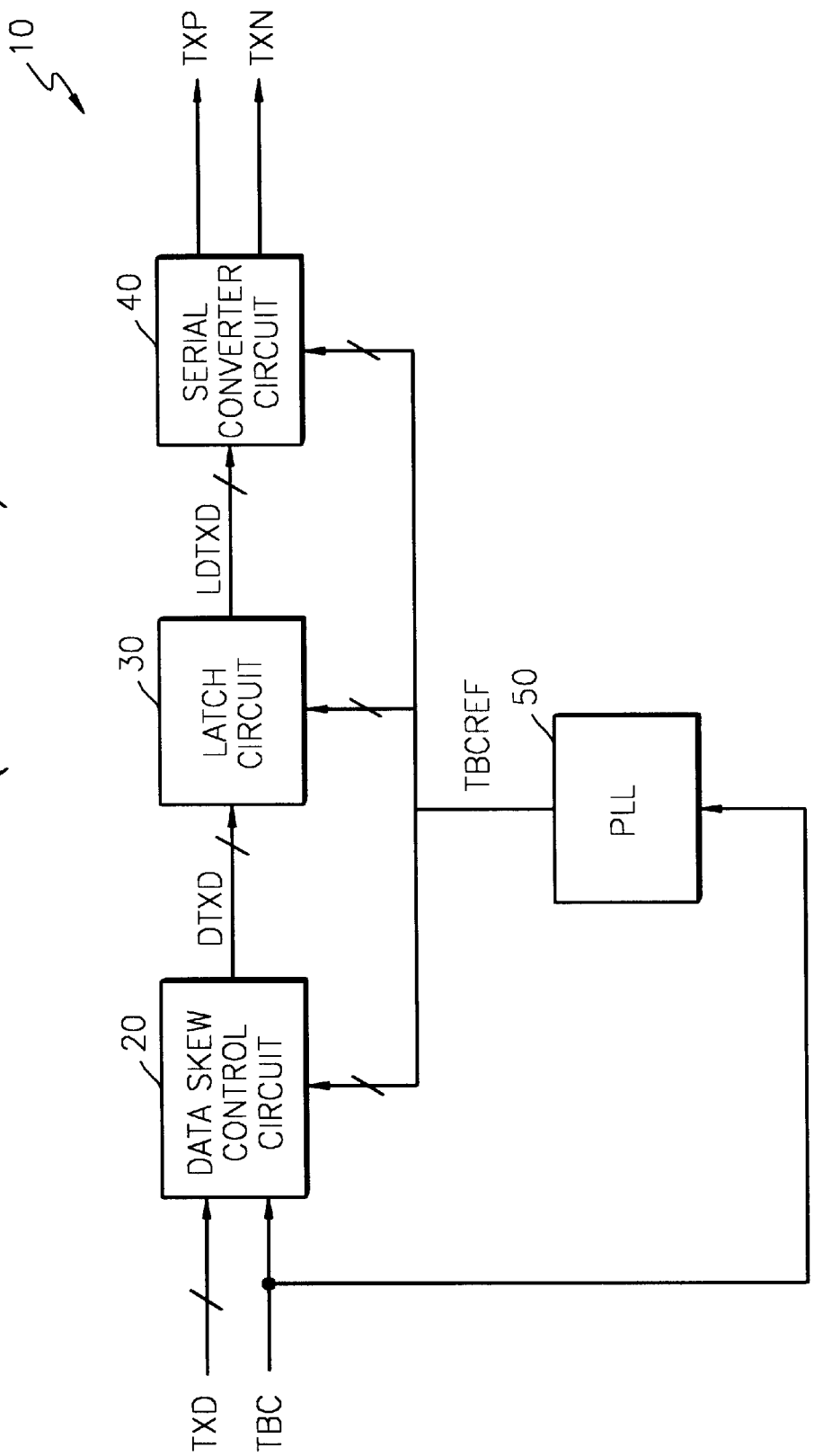
FIG. 1 is a block diagram of a conventional serializer-deserializer circuit.

The present invention will now be described in more detail with reference to the accompanying drawings, in which preferred embodiments of the invention are shown. Here, the same reference numerals in different drawings represent the same element, and thus descriptions thereof will be omitted.

Figure 2:
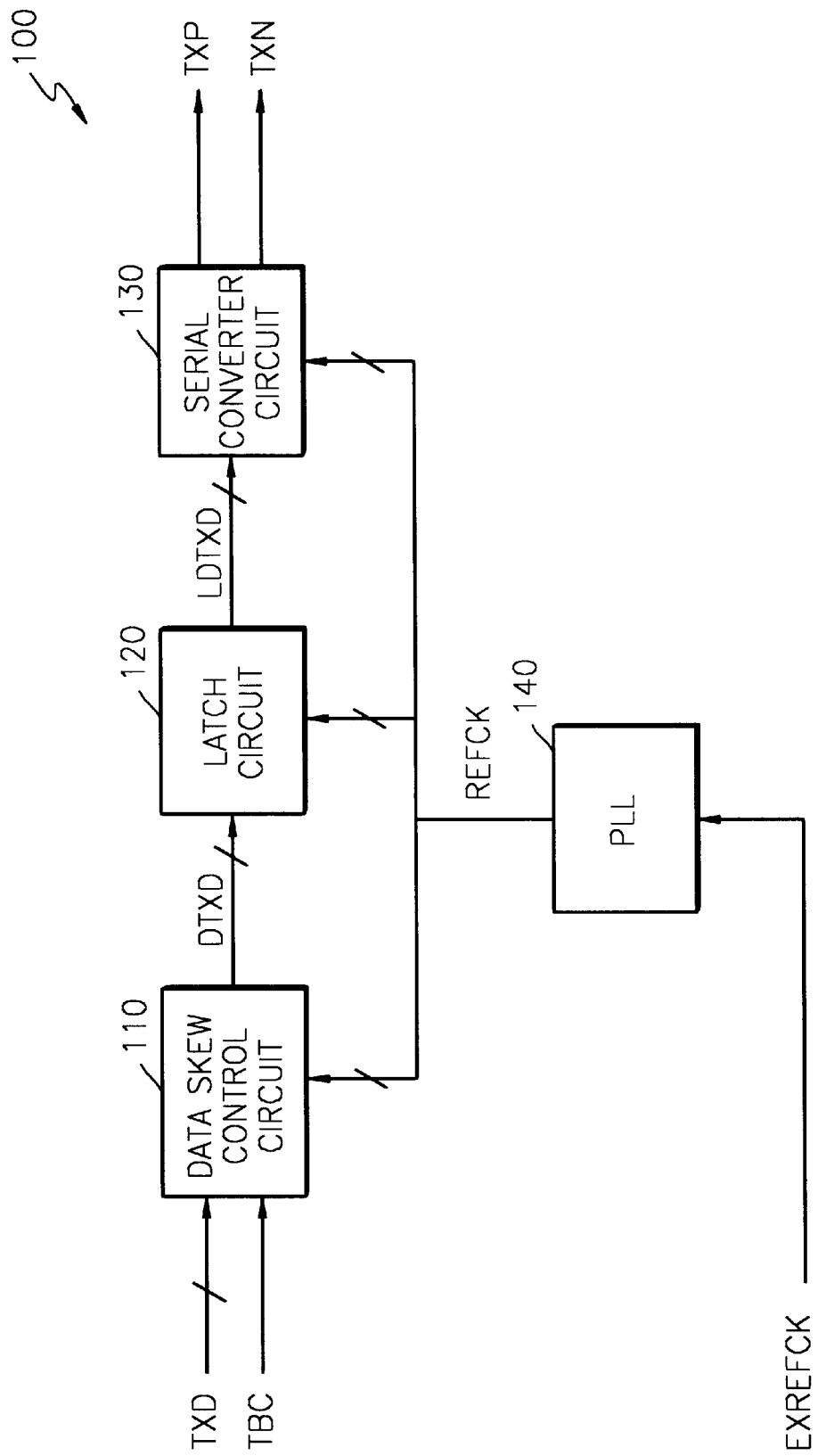
FIG. 2 is a block diagram of a serializer-deserializer circuit according to a preferred embodiment of the present invention.
Figure 3:
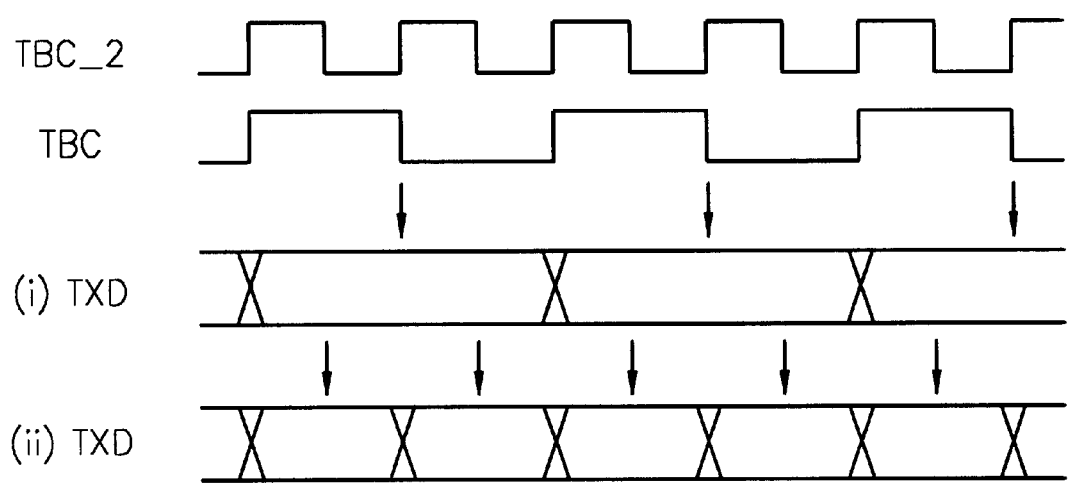
FIG. 3 is a timing diagram of a first clock signal and a data signal of FIG. 2.

FIG. 2 is a block diagram of a serializer-deserializer circuit according to a preferred embodiment of the present invention. FIG. 3 is a timing diagram of a first clock signal and a data signal of FIG. 2. Referring to FIGS. 2 and 3, a serializer-deserializer circuit 100 includes a data skew control circuit 110, a latch circuit 120, a serial converter circuit 130, and a phase locked loop (PLL) 140.

The data skew control circuit 110 receives a first clock signal TBC and a data signal TXD, and delays the data signal TXD and outputs a delayed data signal DTXD in response to a reference clock signal REFCK. The constitution and operation of the data skew control circuit 110 will be described later with reference to FIG. 4.

The latch circuit 120 latches and outputs the delayed data signal DTXD in response to the reference clock signal REFCK. The serial converter circuit 130 receives and serializes an output signal LDTXD of the latch circuit 120 in response to the reference clock signal REFCK, and outputs serial data TXP and TXN.

More specifically, when the data signal TXD has a first speed, the latch circuit 120 latches the data signal TXD at the falling edges of the reference clock signal REFCK. When the data signal TXD has a second speed, the latch circuit 120 latches the data signal TXD at the falling edges of a clock signal having twice the frequency as the reference clock signal REFCK.

The PLL 140 generates the reference clock signal REFCK in response to an external reference clock signal EXREFCK, which is generated by an oscillator. Here, the period of the reference clock signal REFCK is the same as that of the first clock signal TBC. The PLL 140 outputs a clock signal having twice the frequency as the reference clock REFCK, as well as the reference clock signal REFCK.

With reference to FIGS. 2 and 3, the operations of the serializer-deserializer circuit according to a first embodiment of the present invention will be described in detail. Referring back to FIG. 1, in a conventional serializer-deserializer circuit 10, a PLL 50 operates by receiving a first clock signal TBC input to the serializer-deserializer circuit 10 with a data signal TXD. However, a PLL 140 according to the present invention operates by receiving an external reference clock signal EXREFCK. A parallel data signal TXD input to a serializer-deserializer circuit 100 is locked to a first clock signal TBC. The external reference clock signal EXREFCK having a small amount of jitter is generated by an oscillator (not shown). Consequently, the PLL 140 generates a reference clock signal REFCK having a small amount of jitter.

According to the present embodiment of the invention, although the PLL 140 may generate signals having different phases, only the reference clock signal REFCK having the same frequency as the first clock signal TBC and a clock signal having twice the frequency as the reference clock signal REFCK will be considered.

The parallel data signal TXD is latched in the latch circuit 120 in response to the reference clock signal REFCK generated by the PLL 140. Therefore, it is preferable that the frequencies of and the phase relationship between the reference clock signal REFCK and the first clock signal TBC, which is input to the serializer-deserializer circuit 100 with the data signal TXD, are the same at rising and falling edges. As a result, the data signal TXD can be latched without setup or hold time errors that otherwise might be caused by the reference clock signal REFCK. More specifically, a TXD having half of a full speed is shown in FIG. 3($i$) and a TXD having the full speed is shown in FIG. 3($ii$).

Referring to FIG. 3, in case of the data signal TXD having half of a full speed, the data signal TXD should be latched at the falling edges of the first clock signal TBC for the data signal TXD to be latched without setup or hold time errors.

Meanwhile, in case of the data signal TXD having the full speed, the data signal TXD should be latched at the falling edges of a clock signal TBC_2 having twice the frequency as the first clock signal TBC for the data signal TXD to be latched without setup or hold time errors. As a result, by identifying the frequencies of and phase relationship between the reference clock signal REFCK and the first clock signal TBC, the latch circuit 120 can latch the data signal TXD without setup or hold time errors.

Figure 4:
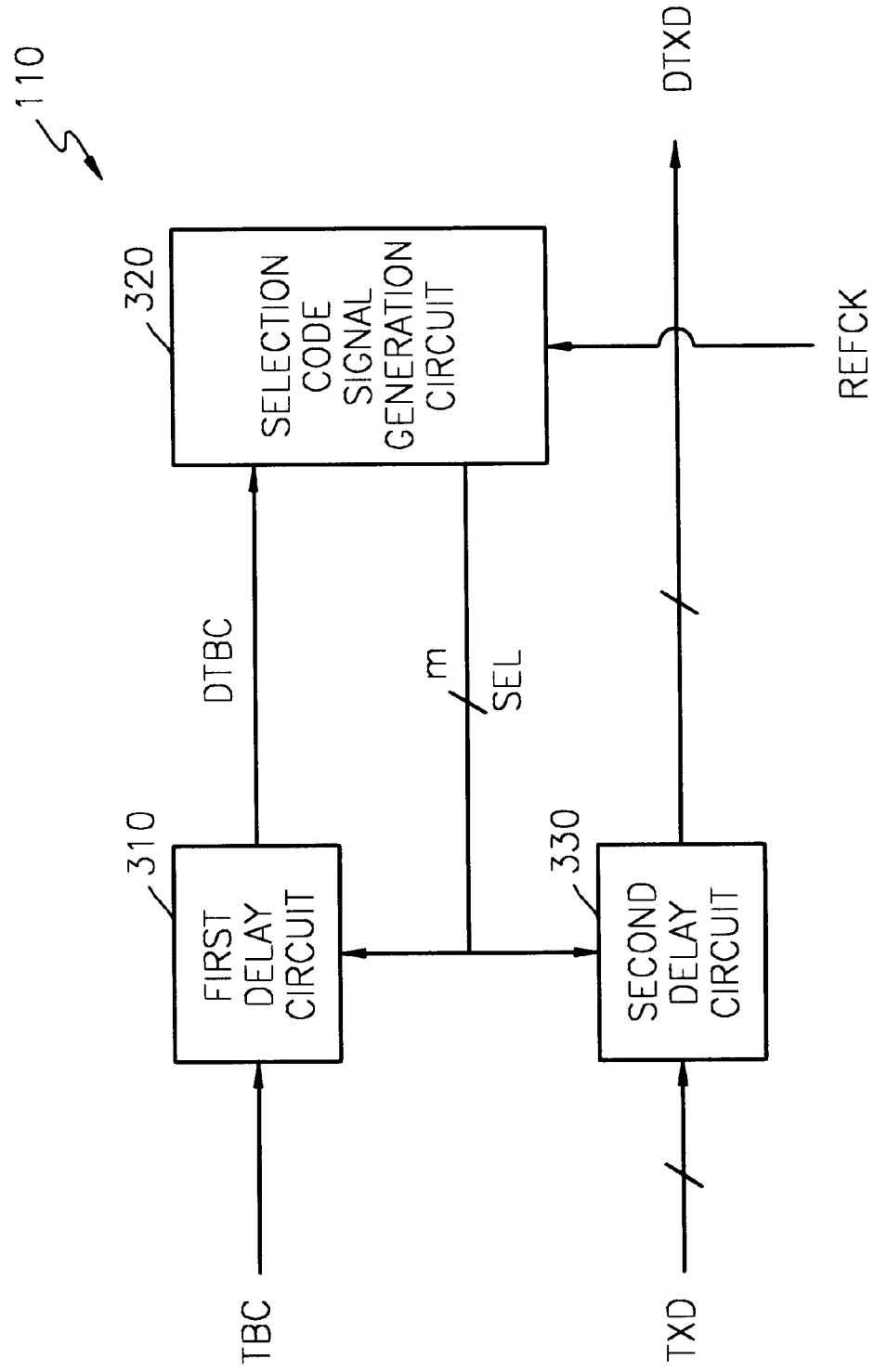
FIG. 4 is a block diagram of a data skew control circuit of FIG. 2.

FIG. 4 is a block diagram of the data skew control circuit 110 of FIG. 2. The data skew control circuit 110 includes a first delay circuit 310, a second delay circuit 330, and a selection code signal generation circuit 320. The first delay circuit 310 receives and delays the first clock signal TBC in response to an m-bit selection code signal SEL to generate a second clock signal DTBC. Here, m is a natural number. The second delay circuit 330 receives and delays the data signal TXD in response to the selection code signal SEL to generate a delayed data signal DTXD.

The selection code signal generation circuit 320 receives the reference clock signal REFCK and the second clock signal DTBC, and varies the logic value of the selection code signal SEL until the phases of the reference clock signal REFCK and the second clock signal DTBC become the same. When the reference clock signal REFCK and the second clock signal DTBC have the same phase, the selection code signal generation circuit 320 fixes the logic value of the selection code signal SEL.

The operation of the date skew control circuit 110 will be described in more detail with reference to FIG. 4. The first delay circuit 310 receives and delays the first clock signal TBC, and outputs the delayed signal as the second clock signal DTBC. In this case, the amount of delay is determined by the selection code signal SEL. The selection code signal generation circuit 320 receives the second clock signal DTBC, and compares the phase of the second clock signal DTBC with the phase of the reference clock signal REFCK.

The selection code signal generation circuit 320 varies the logic value of the m-bit selection code signal SEL in response to the phase difference between the second clock signal DTBC and the reference clock signal REFCK. For example, in a case where the phase of the second clock signal DTBC is ahead of the phase of the reference clock signal REFCK, the selection code signal generation circuit 320 increases the logic value of the selection code signal SEL. In a case where the phase of the second clock signal DTBC is behind the phase of the reference clock signal REFCK, the selection code generation circuit 320 decreases the logic value of the selection code signal SEL.

In such manner, the selection code signal generation circuit 320 varies the logic value of the selection code signal SEL until the phases of the selection clock signal DTBC and the reference clock signal REFCK become the same. When the phases of the reference clock signal REFCK and the second clock signal DTBC are the same, the selection code signal generation circuit 320 fixes the logic value of the selection code signal SEL.

Thereafter, the selection code signal SEL having a fixed logic value is applied to the first delay circuit 310, and the first delay circuit 310 determines the amount of delay of the first clock signal TBC in response to the selection code signal SEL.

The data signal TXD is delayed for the same amount of delay as the first clock signal TBC in response to the selection code signal SEL, and output as the delayed data signal DTXD. Accordingly, by identifying the phases of the first clock signal TBC with those of the reference clock signal REFCK, the proper timing for the latch circuit 120 to latch the data signal TXD can be determined.

Figure 5:
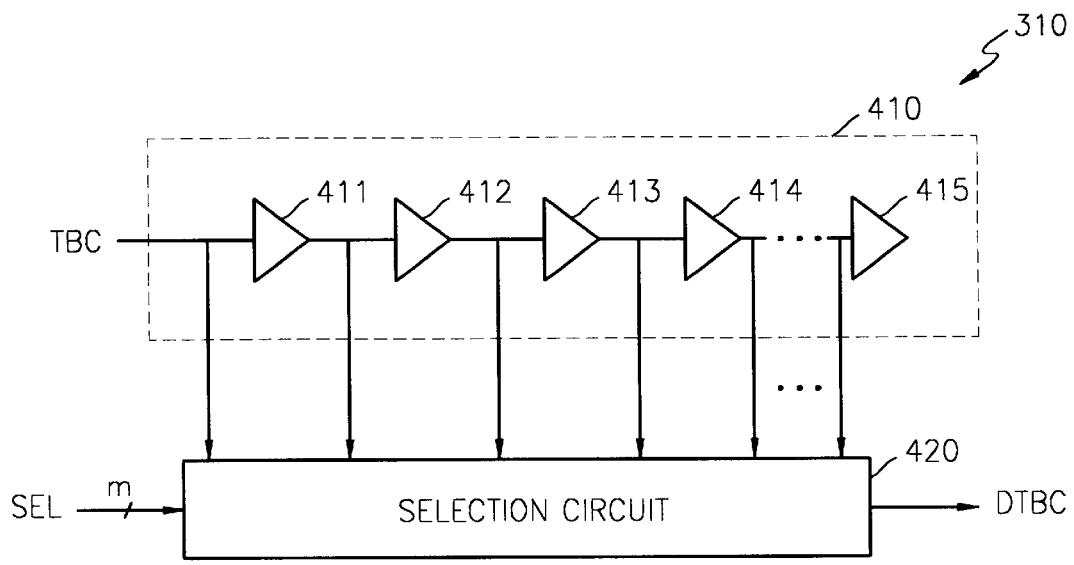
FIG. 5 is a block diagram of a first delay circuit of FIG. 4.

FIG. 5 is a block diagram of the first delay circuit 310 of FIG. 4. The first delay circuit 310 includes a delay buffer unit 410 having a plurality of buffers 411, 412, 413, 414, and 415 that are connected in serial, and a selection circuit 420. A first buffer 411 of the delay buffer unit 410 receives the first clock signal TBC. The selection circuit 420 selects an output from one of the buffers 411, 412, 413, 414, and 415 in response to the selection code signal SEL, and outputs a selected signal as a second clock signal DTBC.

The operation of the first delay circuit will be described in more detail. The first clock signal TBC is input to the first buffer 411 of the delay buffer unit 410. As stated above, the delay buffer unit 410 includes a plurality of buffers 411, 412, 413, 414, and 415 that are connected in serial. As the first clock signal TBC passes through the buffers 411, 412, 413, 414, and 415, the first clock signal is delayed for a predetermined period. Here, the delay time is determined by the size of the buffers 411, 412, 413, 414, and 415.

The selection circuit 420 receives the outputs of the buffers 411, 412, 413, 414, and 415, and selects an output from one of the buffers 411, 412, 413, 414, and 415 in response to the selection code signal SEL, and outputs the selected signal as the second clock signal DTBC.

For example, in a case where the output of the second buffer 412 is selected when the value of the 3-bit selection code signal SEL is 100, the selection circuit 420 outputs the signal from the second buffer 412 as the second clock signal DTBC. When the value of the selection code signal SEL is 101, the output of the third buffer 413 is selected and the selection circuit 420 outputs the signal from the third buffer 413 as the second clock signal DTBC. The selection circuit 420 which performs such operation may be realized as a multiplexer.

The second delay circuit 330 of FIG. 4 has the same constitution as the first delay circuit 310. The data signal TXD is delayed for a delay time, which is determined in response to the logic value of the selection code signal SEL, and output as the delayed data signal DTXD. Here, since the selection code signal SEL is simultaneously input to the first and second delay circuits 310 and 330, the amount of delay of the data signal TXD is the same as that of the first clock signal TBC. Therefore, by identifying the phases of the reference clock signal REFCK with those of the second clock signal DTBC, the latch circuit 120 can latch the delayed data signal DTXD without setup or hold time errors in response to the reference clock signal REFCK.

Figure 6:
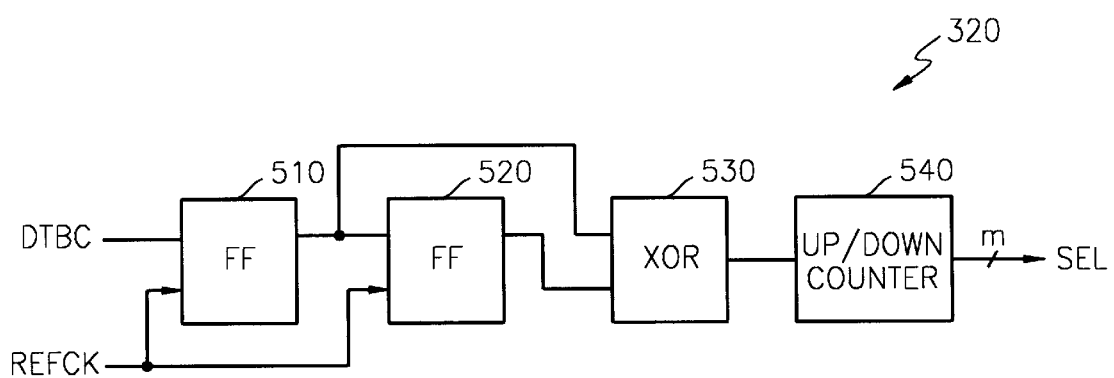
FIG. 6 is a block diagram of a selection code signal generation circuit of FIG. 4.

Referring now to FIG. 6, the selection code signal generation circuit 320 includes a first flip-flop 510, a second flip-flop 520, an exclusive OR unit 530, and an up/down counter 540. The first flip-flop 510 receives and outputs the second clock signal DTBC in response to the reference clock signal REFCK. The second flip-flop 520 receives and outputs the output of the first flip-flop 510 in response to the reference clock signal REFCK. The exclusive OR unit 530 performs an exclusive OR operation on the outputs of the first and second flip-flops 510 and 520. The up/down counter 540 increases and decreases the logic value of the selection code signal SEL in response to the output of the exclusive OR unit 530.

The operations of the selection code signal generation circuit 320 will be described in more detail with reference to FIG. 6. The first and second flip-flops 510 and 520 determine the logic value of the second clock signal DTBC in response to the reference clock signal REFCK to increase the count value of the up/down counter 540. Thereafter, the logic value of the second clock signal DTBC, which is delayed by the next clock cycle of the reference clock signal REFCK, is determined. When the logic values are the same, the count value of the up/down counter 540 is increased. Otherwise, the count value of the up/down counter 540 is decreased.

By repeating the above operation, when the phases of the reference clock signal REFCK and the second clock signal DTBC are the same, the up/down counter 540 continues to increase and decrease based on a specific count value as a reference. As a result, the specific count value is determined and output as the selection code signal SEL.

The edges of the second clock signal DTBC are determined by such a method so that the phases of the reference clock signal REFCK and the second clock signal DTBC remain the same regardless of changes in voltage and temperature during the operation of the serializer-deserializer circuit 100.

Figure 7:
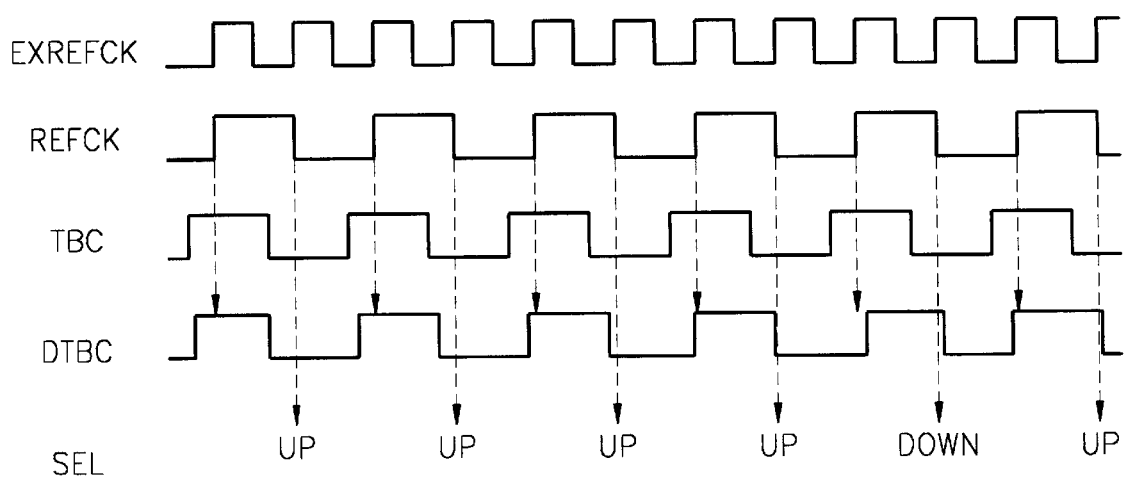
FIG. 7 is a timing diagram for explaining the operation of the data skew control circuit of FIG. 2.

FIG. 7 is a timing diagram for explaining the operation of the data skew control circuit of FIG. 2. FIG. 7 illustrates the first clock signal TBC, the second clock signal DTBC, which is obtained by delaying the first clock signal TBC, the reference clock signal REFCK, and the external reference clock signal EXREFCK. Here, the external reference clock signal EXREFCK has twice the frequency as the reference clock signal REFCK.

The frequencies of the reference clock signal REFCK and the first clock signal TBC are the same. Therefore, the second clock signal DTBC, which is obtained by delaying the first clock signal TBC, has the same frequency as the reference clock signal REFCK. The logic levels of the second clock signal DTBC are recognized at the rising edges of the reference clock signal REFCK, and the count values of the up/down counter 540 are changed at the falling edges of the reference clock signal REFCK.

At a first rising edge of the reference clock signal REFCK, the second clock signal DTBC is at a high level. At a second rising edge of the reference clock signal REFCK, the second clock signal is again at the high level. In this case, since the logic levels of the second clock signal DTBC are the same at one rising edge and a following rising edge of the reference clock signal REFCK, the count value of the up/down counter 540, which generates the selection code signal SEL at falling edges of the reference clock signal REFCK, is increased.

At the third and fourth rising edges of the reference clock signal REFCK, the levels of the second clock signal DTBC are again at the high level. Thus, the count value of the up/down counter 540 that generates the selection code signal SEL is continuously increased.

The level of the second clock signal DTBC is low at a fifth rising edge of the reference clock signal REFCK. In other words, the level of the second clock signal DTBC is changed at the fifth rising edge of the reference clock signal REFCK. Therefore, the count value of the up/down counter 540 is decreased to fix the selection code signal SEL at a predetermined logic value. At this point, the second clock signal DTBC and the reference clock signal REFCK have the same phase. In this case, the second delay circuit 330 delays the data signal TXD for the same delay as the delay applied to the second clock signal DTBC in response to the selection code signal SEL to output the delayed data signal DTXD.

Referring back to FIGS. 2 and 3, the latch circuit 120 latches the delay data signal DTXD in response to the reference clock signal REFCK. The serial converter circuit 130 serializes and outputs the latched delayed data signal DTXD. In a case where the data signal TXD is at the first speed, the latch circuit 120 latches the data signal TXD at falling edges of the reference clock signal REFCK. Here, the first speed is half of the full speed as shown in FIG. 3(*i*). In a case where the data signal TXD is at the second speed, the latch circuit 120 latches the data signal TXD at falling edges of the clock signal having twice the frequency as the reference clock signal REFCK. Here, the second speed is the full speed as shown in FIG. 3(*ii*). The clock signal having twice the frequency as the reference clock signal REFCK may be generated by the PLL 140.

For this, a circuit for latching the data signal TXD at falling edges of the reference clock signal REFCK as well as at falling edges of a clock signal having twice the frequency as the reference clock signal REFCK is needed. Such circuit is well within the skill of those in the art and is not described herein.

The serializer-deserializer circuit 100 according to the first embodiment of the present invention does not use, as an input clock to the PLL 140, the first clock signal TBC, which is input together with the data signal TXD, but uses a signal, which is generated by an oscillator (not shown) and thus has a small amount of jitter. Therefore, a reference clock signal without noise can be generated to improve the operation of the serializer-deserializer circuit 100. In addition, the reference clock signal REFCK output from the PLL 140 and the data signal DTX are locked to increase margins for setup and hold time during the latch operation of the data signal.

As described above, the serializer-deserializer circuit according to the present invention uses a signal, which is generated by an oscillator and thus has a small amount of jitter, as an input clock to a PLL, rather than using the first clock signal, which is input together with the data signal, as the input clock to the PLL. In doing so, a reference clock signal without noise can be generated to improve the operation of the serializer-deserializer circuit. In addition, the reference clock signal output from a PLL and a data signal are locked to increase margins for setup and hold time during the latch operation of the data signal.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A serializer-deserializer circuit comprising:
   a data skew control circuit for receiving a first clock signal and a data signal, delaying the data signal, and outputting a delayed data signal in response to a reference clock signal;
   a latch circuit for latching and outputting the delayed data signal in response to the reference clock signal;
   a serial converter circuit for receiving and serializing the delayed data signal output from the latch circuit in response to the reference clock signal to output serial data; and
   a phase locked loop (PLL) for generating the reference clock signal in response to an external reference clock signal wherein the latch circuit latches the data signal at one of rising edges or falling edges of the reference clock signal when the data signal has a first speed, and the latch circuit latches the data signal at one of rising edges or falling edges of a clock signal having twice the frequency as the reference clock signal when the data signal has a second speed.

2. The serializer-deserializer circuit of claim 1, wherein the data skew control circuit comprises:
   a first delay circuit for receiving and delaying the first clock signal in response to an m-bit selection code signal (where m is a natural number) to generate a second clock signal;
   a second delay circuit for receiving and delaying the data signal in response to the selection code signal to generate a delayed data signal; and
   a selection code signal generation circuit for receiving the reference clock signal and the second clock signal and varying the logic value of the selection code signal until the phase of the reference clock signal is the same as that of the second clock signal.

3. The serializer-deserializer circuit of claim 2, wherein the first delay circuit comprises:
   a delay buffer unit having a plurality of buffers that are connected in serial, the plurality of buffers including a first buffer for receiving the first clock signal; and
   a selection circuit for selecting an output of one of the buffers in response to the selection code signal and outputting a selected signal as the second clock signal.

4. The serializer-deserializer circuit of claim 2, wherein the second delay circuit is identical to the first delay circuit.

5. The serializer-deserializer circuit of claim 1, wherein the period of the first clock signal is the same as that of the reference clock signal.

6. The serializer-deserializer circuit of claim 1, wherein the external reference clock signal is generated by an oscillator.

7. A serializer-deserializer circuit comprising:
   a data skew control circuit for receiving a first clock signal and a data signal, delaying the data signal, and outputting a delayed data signal in response to a reference clock signal;
   a latch circuit for latching and outputting the delayed data signal in response to the reference clock signal; and
   a serial converter circuit for receiving and serializing the delayed data signal output from the latch circuit in response to the reference clock signal to output serial data;
   a phase locked loop (PLL) for generating the reference clock signal in response to an external reference clock signal,
   wherein the data skew control circuit comprises:
      a first delay circuit for receiving and delaying the first clock signal in response to an m-bit selection code signal (where m is a natural number) to generate a second clock signal;
      a second delay circuit for receiving and delaying the data signal in response to the selection code signal to generate a delayed data signal;
      a selection code signal generation circuit for receiving the reference clock signal and the second clock signal and varying a logic value of the selection code signal until the phase of the reference clock signal is the same as that of the second clock signal;
      a first flip-flop for receiving and outputting the second clock signal in response to the reference clock signal;
      a second flip-flop for receiving and outputting the output of the first flip-flop in response to the reference clock signal;
      an exclusive OR unit for performing an exclusive OR operation on the outputs of the first and second flip-flops; and
      an up/down counter for increasing and decreasing a logic value of the selection code signal in response to the output of the exclusive OR unit.

8. A serializer-deserializer circuit comprising:
   a data skew control circuit for receiving a first clock signal and a data signal, delaying the data signal, and outputting a delayed data signal in response to a reference clock signal;
   a latch circuit for latching and outputting the delayed data signal in response to the reference clock signal;
   a serial converter circuit for receiving and serializing of the delayed data signal output from the latch circuit in response to the reference clock signal to output serial data; and
   a phase locked loop (PLL) for generating the reference clock signal in response to an external reference clock signal,
   wherein the PLL outputs the reference clock signal and a clock signal having twice the frequency as the reference clock signal.

9. The serializer-deserializer circuit of claim 8, wherein the data skew control circuit comprises:
   a first delay circuit for receiving and delaying the first clock signal in response to an m-bit selection code signal (where m is a natural number) to generate a second clock signal;
   a second delay circuit for receiving and delaying the data signal in response to the selection code signal to generate a delayed data signal; and
   a selection code signal generation circuit for receiving the reference clock signal and the second clock signal and varying a logic value of the selection code signal until the phase of the reference clock signal is the same as that of the second clock signal.

10. The serializer-deserializer circuit of claim 9, wherein the first delay circuit comprises:
    a delay buffer unit having a plurality of buffers that are connected in serial, the plurality of buffers including a first buffer for receiving the first clock signal; and
    a selection circuit for selecting an output of one of the buffers in response to the selection code signal and outputting a selected signal as the second clock signal.

11. The serializer-deserializer circuit of claim 9, wherein the second delay circuit is identical to the first delay circuit.

12. The serializer-deserializer circuit of claim 8, wherein the period of the first clock signal is the same as that of the reference clock signal.

13. The serializer-deserializer circuit of claim 8, wherein the external reference clock signal is generated by an oscillator.

14. A data skew control circuit comprising:
    a first delay circuit for receiving and delaying a first clock signal in response to an m-bit selection code signal (where m is natural number) to generate a second clock signal;
    a second delay circuit for receiving and delaying a data signal in response to the m-bit selection code signal to generate a delayed data signal; and
    a selection code signal generation circuit for receiving a reference clock signal and the second clock signal, and varying the logic value of the selection code signal until the phase of the reference clock signal is the same as that of the second clock signal wherein the selection code signal generation circuit comprises:

a first flip-flop for receiving and outputting the second clock signal in response to the reference clock signal;

a second flip-flop for receiving and outputting an output of the first flip-flop in response to the reference clock signal;

an exclusive OR unit for performing an exclusive OR operation on the outputs of the first and second flip-flops; and an up/down counter for increasing and decreasing a logic value of the selection code signal in response to the output of the exclusive OR unit.

15. The data skew control circuit of claim 14, wherein the first delay circuit comprises:

a delay buffer unit having a plurality of buffers that are connected in serial, wherein the plurality of buffers include a first buffer for receiving the first clock signal; and a selection circuit for selecting an output from one of the buffers in response to the selection code signal and outputting a selected signal as the second clock signal.

16. The data skew control circuit of claim 14, wherein the second delay circuit is identical to the first delay circuit.

17. The data skew control circuit of claim 14, wherein the period of the first clock signal is the same as that of the reference clock signal.

18. The data skew control circuit of claim 14, wherein the reference clock signal is generated by a PLL, which is operated in response to an external reference clock signal generated from a predetermined oscillator.

* * * * *